United States Patent [19]

Yi Zi

[11] Patent Number: 4,760,436
[45] Date of Patent: Jul. 26, 1988

[54] PHOTO-ELECTRIC TRANSDUCER

[75] Inventor: Xing Yi Zi, Delft, Netherlands

[73] Assignee: Nederlandse Centrale Organisatie Voor Toegepast Natuurwetenschappelijk Onderzoek, Netherlands

[21] Appl. No.: 865,531

[22] Filed: May 21, 1986

[30] Foreign Application Priority Data

May 24, 1985 [NL] Netherlands ............... 8501501

[51] Int. Cl.$^4$ .................. H01L 29/06; H01L 27/14; H01L 31/08
[52] U.S. Cl. .................... 357/30; 357/20; 250/338.4; 250/332; 250/370.01; 250/370.08; 250/370.11
[58] Field of Search ............. 357/20, 30; 250/338.4, 250/332, 370.01, 370.08, 370.11

[56] References Cited

U.S. PATENT DOCUMENTS

| | | | |
|---|---|---|---|
| 3,207,902 | 9/1965 | Sandborg | 357/30 D |
| 3,222,531 | 12/1965 | Morrison | 357/30 D |
| 3,351,493 | 11/1967 | Weiman et al. | 357/30 D |
| 3,354,313 | 11/1967 | Lombard et al. | 357/30 Q |
| 3,435,232 | 3/1969 | Sorensen | 357/30 D |
| 3,742,223 | 6/1973 | Carr et al. | 357/30 D |
| 3,863,072 | 1/1975 | Garin et al. | 250/370 H |
| 4,131,793 | 12/1978 | Stoutmeyer et al. | 357/30 Q |

OTHER PUBLICATIONS

Noorlag, *Lateral–Photoeffect Position Sensitive Detectors*, Tech. Univ., Delft, Netherlands, Thesis, Sep. 28, 1982.

*Primary Examiner*—Andrew J. James
*Assistant Examiner*—Jerome Jackson, Jr.
*Attorney, Agent, or Firm*—Beehler, Pavitt, Siegemund, Jagger, Martella & Dawes

[57] ABSTRACT

A photo-electric transducer, comprising a semiconductor wafer with, near its free surface, a region of the opposite conductivity type which is transparent for radiation, adapted for generating photo-currents when being irradiated, said currents flowing through said region towards electrodes connected to means for measuring the ratio between the currents flowing towards the respective electrodes so as to derive therefrom the distance between the point of incidence of the radiation and said electrodes, said region being defined by substantially concentric circles in conformity with the trajectory of a radiation spot; in particular switching means are provided which either disable an electrode when being crossed by said spot, or, in the case of multiple spots incident on different portions of said region, disable a spot when crossing an electrode.

6 Claims, 2 Drawing Sheets

PHOTO-ELECTRIC TRANSDUCER

The invention relates to a photo-electric transducer with lateral photo-effect, comprising a high-resistance semiconductor wafer which closely near its free surface is provided with a region extending parallel thereto, said region having an oppposite conductivity type and a higher doping concentration than the wafer, said region being sufficiently transparent for radiation so that, if the pn junction between said region and said wafer is reversely biassed, photo-currents are generated in the junction region, which mainly flow through said region, electrodes being provided for collecting said currents which are connected to means adapted to measure the ratio between the currents flowing from a point of incidence of radiation towards the respective electrodes so as to derive therefrom the distance from said point of incidence in respect of said electrodes.

Such a transducer is described in a thesis of D. J. W. Noorlag, "Lateral Photo-Effect Position-Sensitive Detectors", Delft (1982). The phenomenon of charge carriers generated in the point of incidence of the radiation laterally flowing off is called the lateral photo-effect. When in a square or rectangular wafer two sets of mutually perpendicular electrodes are used, the location of the point of incidence of the radiation can be unambiguously determined in two co-ordinate directions, and the co-ordinates thus determined relate to the centre of gravity of the incident radiation spot. Such transducers can operate at low radiation intensities.

In some cases such a determination of the location in two co-ordinate directions is, however, unfavourable. If, for instance, the radiation spot is moving along a linear and in particular a curved trajectory, the use of such wafers with a substantially rectangular or square shape is less sensible, in particular since the transformation of orthogonal co-ordinates into those of a circular trajectory is cumbersome.

It is an object of the invention to provide a transducer of the above-mentioned kind which is suitable for such a location determination.

To that end the transducer according to the invention is characterised in that the region of opposite conductivity type is defined by substantially concentric circles, and has the shape of the trajectory described by the radiation spot, said region not being substantially wider than the incident radiation spot, and being provided with at least two electrodes extending transversely to the longitudinal direction, all this in such a manner that said electrodes are adapted to collect the currents flowing in the longitudinal direction through said region when radiation is incident therebetween.

Such a transducer appears to be excellently suitable for determining the angular position of a radiation spot moving along a circular trajectory, the current intensity ratio's being accurately inversely proportional to the respective angular distances of the radiation spot to the adjacent terminal electrodes. Therefore no transformation has to take place for obtaining an accurate determination of the position of the radiation spot.

In particular said region has a closed annular shape, said region then being divided by at least two thin electrodes into a corresponding number of segments. Such a construction is, in particular, intended for radiation spots which are adapted to describe a continuous circular movement over more than one revolution.

In order to counteract deviations from the linearity near said electrodes, the means for measuring the current ratio, if the number of electrodes is more than three, can always be connected to two electrodes between which the radiation is incident and wherebetween an other electrode is situated, and, as soon as the radiation spot approaches the electrode connected to the ratio measurement means, the processing circuit interrupts the connection with said electrodes and includes the intermediate electrodes in the measurement.

In this manner the disturbing influence of crossing an electrode by the radiation spot is suppressed, and the operation will always be in the region of perfect linearity.

Another embodiment with removal of this linearity deviation comprises means for producing at least two radiation spots incident in different points and having such a mutual angular position that, when one thereof is situated near an electrode, the other is present in the region half-way between two electrodes and vice versa, means being present to restrict the measurements to the latter one.

In a special embodiment of the last-mentioned transducer, the region of opposite conductivity type common two or more concentric partial regions with associated electrodes, the processing circuit then being adapted to switch on the electrode of that partial region in which the associated radiation spot is not situated near the electrodes in question.

In particular these partial regions are made mainly C-shaped, the connections towards the electrodes then being led through the openings in the C.

The invention will be elucidated below in more detail by reference to a drawing, showing in:

Figure 1:
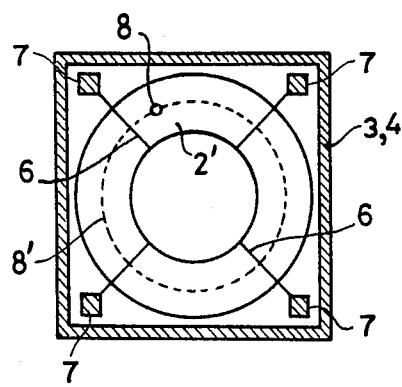
FIGS. 1 and 2 is a diagrammatical representation in elevation and cross-section resp. of a transducer according to the invention.
Figure 2:
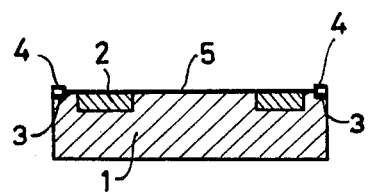

FIGS. 1 and 2 show, in a highly simplified way, a first embodiment of the transducer according to the invention. In a wafer 1 of n-type semiconductor material having a high conductivity, in particular silicon, a shallow circular p-type region 2 is formed having a lower conductivity than the n-type substrate 1. A n+-type rim 3 is provided with a terminal 4, and provides a connection with the substrate. It is also possible to arrange said terminal at the other side of the wafer 1.

When applying a voltage in the reverse sense, a junction is formed between the substrate 1 and the region 2, said junction lying, for the greater part, inside the substrate 1. Therefore the region 2 can be considered as a resistor layer with a constant thickness. In the junction region thus formed, the lateral photo-effect will take place when being irradiated. The region 2 is so thin that the radiation incident thereon can reach said junction. A thin insulating coating 5 covers the surface of the wafer 1.

In the region 2 four narrow metallic electrodes 6 are provided at equal angular distances, said electrodes leading towards connection points 7 which, as the rim 4, are not covered by the coating 5. These electrodes divide the region 2 into quadrants 2' each defined by two electrodes 6. The number of electrodes is, for the rest, not restricted to two as will appear from the following.

If a radiation spot 8 which is adapted to move along a circular trajectory 8' is situated between two electrodes 6, the currents towards these electrodes will be inversely proportional to the distances between the centres of gravity of the radiation spot 8 and the electrodes in question.

The circular trajectory 8' of the spot 8 can be obtained by means of an optical system adapted to deflect or screen the radiation originating from a source in such a manner that the deflected or transmitted ray describes a conical or cylindrical surface, the circle 8' being the line of intersection of this surface and the plane of the wafer. Such systems can comprise, for instance, a mirror rotatable coaxially in respect of the circle 8' or the like, and it is also possible to use for this purpose a radiation conducting fibre having an exit face describing the circular trajectory 8'.

Figure 3:
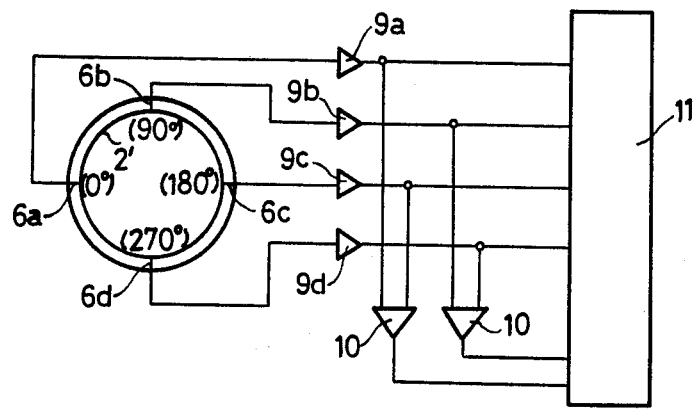
FIG. 3 is a block diagram of a circuit for processing the measuring currents obtained by means of such a transducer.

FIG. 3 shows a diagrammatical representation of a circuit for processing the measuring currents. The individual electrodes 6a . . . d are each connected to an associated amplifier 9a . . . d resp., and the diametrically opposite electrodes 6a and c and 6b and d are connected to an associated comparator 10. The outputs of the amplifiers 9 and comparators 10 are connected to a suitable processing circuit 11. The comparators 10 detect in which segment 2' the radiation spot has been incident, and produce a control signal which relates the ratio measurement performed in said circuit to the correct segment. In particular the outputs of the amplifiers 9 are connected with a resistor circuit for determining the total current, so that the ratio measurement can be restricted to a measurement of the ratio between the output current of an amplifier and said total current.

Figure 4:
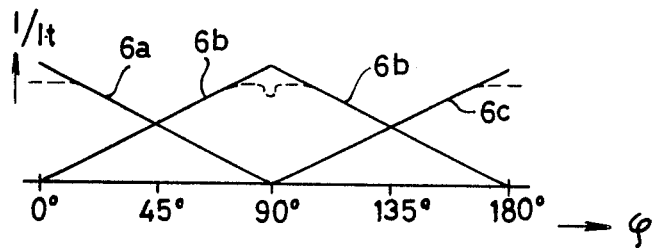
FIG. 4 is a graphic representation of the values of the current ratio's in different points of incidence of radiation on such a transducer.

In the diagram of FIG. 4 the currents in the connections of adjacent electrodes 6 in fucntion of the distance of the incident radiation to the electrode in question is shown in continuous lines, the ratio between the electrode current and the total current being plotted on the vertical axis. These currents are, then, inversely proportional to the corresponding distances.

The actual behavior in the vicinity of an electrode 6 is shown by a dotted line. When the radiation spot crosses an electrode 6, this spot is divided by said electrode in two portions lying in different segments and each having their own centre of gravity deviating from the real centre of gravity of the spot as a whole. Moreover a part of the radiation is masked by the electrode, although this effect is relatively small as the electrodes can be made very narrow. It will appear herefrom that in the vicinity of the electrodes the linearity is lost, which is detrimental for processing the measuring results and will seriously impair the accuracy of the measurement.

This objection can be removed by slightly modifying the circuit of FIG. 3. The comparators 10 are then replaced by ratio meters adapted to be alternately enabled by the processing circuit 11. This means that, now, the current ratio measurment always takes place at two diametrically opposite electrodes 6a and 6c or 6b and 6d, and the intermediate electrodes are not involved in the measurement and therefore remain floating. Switching towards the other pair takes place half-way the segment between the floating electrode and the electrode taking part in the measurement which is approached by the radiation spot, so that, as will be elucidated by reference to FIG. 5, the operation always takes place in the linear measurement range of an electrode pair.

Figure 5:
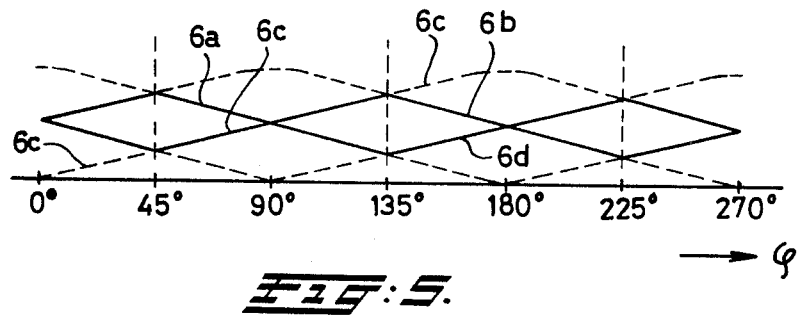
FIG. 5 is a graphic representation corresponding to that of FIG. 4 for the case of a modified embodiment of the circuit of FIG. 4.

FIG. 5 shows a diagram corresponding to FIG. 4, wherein the used portions of the measuring ranges of electrode pairs are shown in continuous lines, and the not-used portions in dashed lines. It will be apparent therefrom that in this manner the regions with linearity deviations can be excluded from the measurement. Since on the switching moment the measuring values obtained with the adjacent electrodes in question are mutually equal, switching will not cause a jump in the measurement.

An other solution of the problem of the linearity deviation can be obtained by using a multiple radiation spot. In a modified embodiment of FIG. 3, for instance, only the electrodes 6a and 6c are used, and two radiation spots having an angular distance of 90° can be switched on alternately. The leading spot will, then, be switched on in a 90° range around the no longer used electrode 6b or 6d, and the trailing spot, which is switched off, will be present in the range of the electrode 6a or 6c. As soon as this range is being left, switching over towards the other spot takes place so that the now inoperative leading spot can cross the electrode 6c or 6a. Such spots can be obtained, for instance, by means of a beam splitting mirror or prism, but it is generally simpler to use to this end radiation conducting fibres.

Switching over said radiation spots is, however, objectionable. FIG. 6 shows a different solution in which electrical switching can be used as in the case of FIG. 3.

Figures 6A, 6B:
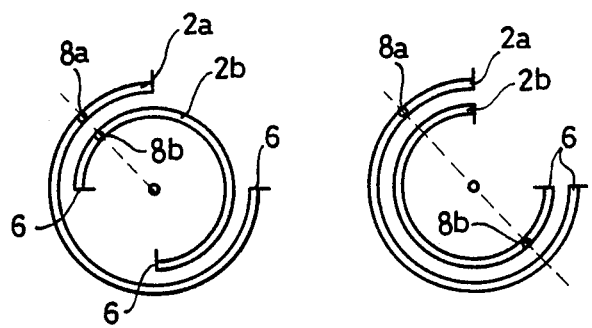
FIGS. 6a and b are diagrammatical views of a modified embodiment of the transducer of FIG. 1.

In the case of FIG. 6a there are two concentric regions 2a and 2b, each with a span of more than 180°, for instance 270° as shown, which regions are provided at their extremities with electrodes 6. These regions are mutually offset by 180°. Both radiation spots 8a and 8b arenow juxtaposed on the same radius, but lie on different regions 2a or 2b. The processing circuit determines, in the juxtaposed portions of the regions 2a and 2b, the angular position of both spots which should provide the same results. At the opening in one of said regions a single measurement takes place. The angular extensions of these regions should be so large that one region overlaps the opening of the other one, and the operative radiation spot is situated at a sufficient distance from the terminal electrodes in question.

A draw-back of the embodiment of FIG. 6a is that it is difficult to make the electrode connections to the inner region 2b. FIG. 6b shows a modified embodiment in which both regions extend in a fully parallel way, but in which both radiation spots have an angular distance of 180°, which has the same effect as mutually offsetting the regions 2a and 2b according to FIG. 6a. In the embodiment of FIG. 6b the connections can be made in a simple manner.

It will be clear that the shape and number of the regions can still be modified on the basis of the abovementioned principle. More specifically use can be made of completely closed regions, but the open regions of FIG. 6 have the advantage that, then, the connections can be made in a considerably easier way.

The transducers described above can be used in every case where a radiation spot describes a circular trajectory. The great advantage thereof over the known transducers is that no transformation from orthogonal to polar co-ordinates is required, and a linear position determination is immediately obtained.

Radiation spots moving along a circular trajectory are obtained, for instance, when the angular position of a rotatable element such as a shaft or the like is to be determined, a radiation deflecting element then being adapted to deflect the radiation of a fixedly mounted radiation source, or the radiation source itself is mounted on the movable element.

It will be clear that the expressions n- and p-type conductivity used in respect of the wafer of FIGS. 1 and 2 are only used by way of example, and that also the respective opposite conductivity types can be used if this would be favourable.

I claim:

1. A lateral photo-effect photo-electric transducer, comprising a high-resistance semiconductor wafer which closely near its free surface is provided with a region extending parallel thereto, said region having an opposite conductivity type and a larger doping concentration than the wafer, said region being sufficiently transparent for radiation so that, if the pn junction between said region and said wafer is reversely biassed, upon irradiation photo-currents are generated in the junction region, which mainly flow through said region, electrodes being provided for collecting said currents which are connected to means adpated to measure the ratio between the currents flowing from a point of incidence of radiation towards the respective elektrodes so as to derive therefrom the distance from said point of incidence in respect of said electrodes, characterised in that the region of opposite conductivity type (2) is defined by substantially concentric circles, and has the shape of the trajectory described by a radiation spot (8), said region not being substantially wider than the incident radiation spot (8) and being provided with at least two electrodes (6) extending transversely to the longitudinal direction, all this in such a manner that said electrodes (6) are adapted to collect the currents flowing in the longitudinal direction through said region when radiation is incident therebetween.

2. The transducer of claim 1, characterised in that the region (2) has a closed annular shape, and is divided by at least two thin elecrodes (6) into a corresponding number of segments (2').

3. The transducer of claim 2, characterised in that, if the number of electrodes (6) is more than three, the means (10) for measuring the current ratio are always connected to two electrodes (6) between which the radiation is incident and wherebetween an other electrode (6) is situated, and, as soon as the radiation spot approaches the electrode (6) connected to the ratio measurement means (10), the processing circuit (11) interrupts the connection with this electrode, and includes the intermediate electrode in the measurement.

4. The transducer of claim 1, characterised by means for producing at least two radiation spots (8a, 8b) incident in different points, and having such a mutual angular position that, when one thereof is situated near an electrode (6), the other one is present in the region half-way between two electrodes and vice versa, means being present to restrict the measurement to the latter one.

5. The transducer of claim 4, characterised in that the region of opposite conductivity type comprises two or more concentric partial regions (2a, 2b) with associated electrodes (6), the processing circuit (11) being adapted to switch on the electrodes (6) of that partial region (2a, 2b), in which the associated radiation spot (8a, 8b) is not situated near the electrodes (6) in question.

6. The transducer of claim 5, characterised in that the partial regions (6a, 6b) are mainly C-shaped, the connections to the electrodes being led through the openings in C.

* * * * *